(12) United States Patent
Uezono

(10) Patent No.: US 7,172,436 B2
(45) Date of Patent: Feb. 6, 2007

(54) CIRCUIT BOARD ASSEMBLING STRUCTURE

(75) Inventor: Koichi Uezono, Ogasa-gun (JP)

(73) Assignee: Yazaki Corporation, Tokyo (JP)

( * ) Notice: Subject to any disclaimer, the term of this patent is extended or adjusted under 35 U.S.C. 154(b) by 382 days.

(21) Appl. No.: 10/800,677

(22) Filed: Mar. 16, 2004

(65) Prior Publication Data
US 2004/0184244 A1    Sep. 23, 2004

(30) Foreign Application Priority Data
Mar. 17, 2003  (JP) .......................... P2003-071337

(51) Int. Cl.
*H01R 12/00* (2006.01)
(52) U.S. Cl. ................. 439/76.2; 439/620.27
(58) Field of Classification Search ............... 439/76.2, 439/949, 620.27
See application file for complete search history.

(56) References Cited

U.S. PATENT DOCUMENTS 6,514,091 B2 *  2/2003  Saito et al. ............... 439/76.2
6,846,183 B2 *  1/2005  Kato et al. ................. 439/20

FOREIGN PATENT DOCUMENTS

JP             9-140028 A        5/1997

* cited by examiner

*Primary Examiner*—Neil Abrams
(74) *Attorney, Agent, or Firm*—Sughrue Mion, PLLC

(57) ABSTRACT

A first board, on which electric wires are wired, includes a first part having a first thickness and a second part continued from the first part and having a second thickness smaller than the first thickness. A second board, on which bus bars are arranged, is disposed on the second part of the first board. The second board has a third thickness which is determined such that an additional thickness of the second thickness and the third thickness is not greater than the first thickness.

8 Claims, 3 Drawing Sheets

CIRCUIT BOARD ASSEMBLING STRUCTURE

BACKGROUND OF THE INVENTION

The present invention relates to a circuit board assembling structure which is applied to an electric junction box or the like, and adapted to assemble a wiring circuit board on which electric wires are arranged and a bus bar circuit board on which bus bars are arranged thereby to constitute a circuit board assembly.

FIG. 3 shows one example of a conventional circuit board assembling structure for an electric junction box, which is disclosed in Japanese Patent Publication No. 9-140028A (cf., page 3 and FIG. 2).

This electric junction box 51 includes a plurality of bus bar circuit boards 52 to be stacked one on another, and a wiring circuit board 53 disposed below the bus bar circuit boards 52. The bus bar circuit boards 52 and the wiring circuit board 53 constitute a circuit board assembly, and upper and lower covers 54 and 55 made of synthetic resin contain the circuit board assembly.

Each of the bus bar circuit boards 52 includes a plurality of bus bars 56 made of conductive sheet metal in desired shapes, and an insulative substrate 57 on which the bus bars 56 are arranged. The bus bars 56 are provided with tab terminals 58 which are continuously extended from their end portions or intermediate portions. The terminals 58 are received in connector housings 59 of the upper cover 54 thereby to constitute a connector, or connected to fuses and relays in the upper cover by way of relay terminals 60 of a female type.

The wiring circuit board 53 includes a plurality of electric wires 61, and a case 62 made of insulative resin on which the electric wires 61 in desired shapes are arranged. Each of the electric wires 61 is press-fitted to one contact portion 63a of a terminal 63 at a desired position inside the case. The other contact portion 63b of the terminal 63 is passed through a hole 64 of the case 62 to be connected to a terminal of the bus bar 56, or passed through the lower cover 55 to be received in connector housings below the lower cover 55.

The bus bars 56 are mainly suitable for a large current circuit such as a power source circuit, and the electric wires 61 are mainly suitable for a small or middle current circuit such as a signal circuit. The bus bars 56 and the electric wires 61 are connected to each other so that an electric power can be supplied to the connector of the lower cover 55. Exterior wire harnesses (not shown) continued to the power source and an auxiliary equipment are connected to the connectors of the upper and lower covers 54, 55.

However, in the above described configuration, since the bus bar circuit boards 52 and the wiring circuit board 53 are stacked in a direction of their thickness, the more specifications of the circuits becomes complicated, the more the circuit board assembly become upsized in a vertical direction, so that the electric junction box 51 accordingly become large-sized. Further, since the bus bar circuit boards 52 has to be assembled to the wiring circuit board 53 after the wiring board 53 is assembled to the lower cover 55, a lot of working steps are required in assembling the circuit board assembly, that is, the electric junction box 51.

SUMMARY OF THE INVENTION

It is therefore an object of the invention to provide a circuit board assembling structure in which a circuit board assembly can prevented from being upsized in a stacking direction thereby to obtain a compact electric junction box.

It is also an object of the invention to provide a circuit board assembling structure which is easily assembled with less working steps.

In order to achieve the above objects, according to the invention, there is provided a circuit board assembly, comprising:

a first board on which electric wires are wired, the first board including a first part having a first thickness and a second part continued from the first part and having a second thickness smaller than the first thickness; and a second board on which bus bars are arranged, the second board disposed on the second part of the first board.

In such a configuration, the circuit board assembly can be downsized in the thickness direction thereof by the size corresponding to the difference between the first thickness and the second thickness. The weight of the assembly can be also reduced. The first board and the second board are integrated in advance to constitute the circuit board assembly, and the assembly is then accommodated in a cover of an electric junction box. Accordingly, the electric junction box can be easily manufactured with less operation steps.

Preferably, the second part is defined by forming stepped portions in both main faces of the first board; and the second board is disposed on each of the stepped portion.

In such a configuration, since two of the second boards are provided for the single first board, the assembly can be adapted to various circuit configurations. Especially in a case where circuits to be connected are arranged in both sides facing the main faces, such adaptation can be performed efficiently. In a case where the stepped portions are formed symmetrically with regard to the thickness direction of the first board, the assembly can be obtained with good balance.

Here, it is preferable that the second board disposed on one of the stepped portion is fixed on another board on which electric wires are wired.

In such a configuration, at the same time when the two boards for wiring electric wires are stacked, the second board on one wiring board is disposed on one of the stepped portions of the other wiring board. Since the other second board is disposed in advance in the other stepped portion of the other wiring board, the two of the second boards can be arranged at the same time when both the wiring boards are stacked. Therefore, a work for electrical connection between the first board and the second board by press-fitting or welding can be simplified. After the connection has been finished, both the wiring boards are stacked.

Preferably, the second board has a third thickness which is determined such that an additional thickness of the second thickness and the third thickness is not greater than the first thickness.

In such a configuration, not only the circuit board assembly can be made compact in the direction of thickness, but other components such as other circuit boards, covers, electronic control units can be disposed on a same plane without a clearance or with a slight clearance, across the first board and the second board. Moreover, since the circuit board assembly has no protuberance both on the main faces, the circuit board assembly can be smoothly mounted into the cover of the electric junction box, thus enhancing assembling workability.

Preferably, the second board is formed with grooves for receiving the bus bars.

In such a configuration, the bus bars can be positioned and arranged easily and accurately, and at the same time, the thickness of the second board including the bus bars can be reduced. Moreover, since the bus bars are insulated from one another by the grooves, additional insulating means is not necessary.

Preferably, the electric wires and the bus bars are electrically connected.

In such a configuration, the first board and the second board are connected to each other, and the circuit board assembly which is integral in both electrical and structural aspects can be formed. For example, by employing press-fitting terminals as terminals of the bus bars, connection between the electric wires and the terminals, that is, interconnection between the boards becomes easy and efficient. Large electric current such as a power source flows by way of the bus bars, and small or middle electric current such as a signal flows by way of the electric wires.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE INVENTION

One embodiment of the invention will be described below in detail referring to the accompanying drawings.

Figure 1:
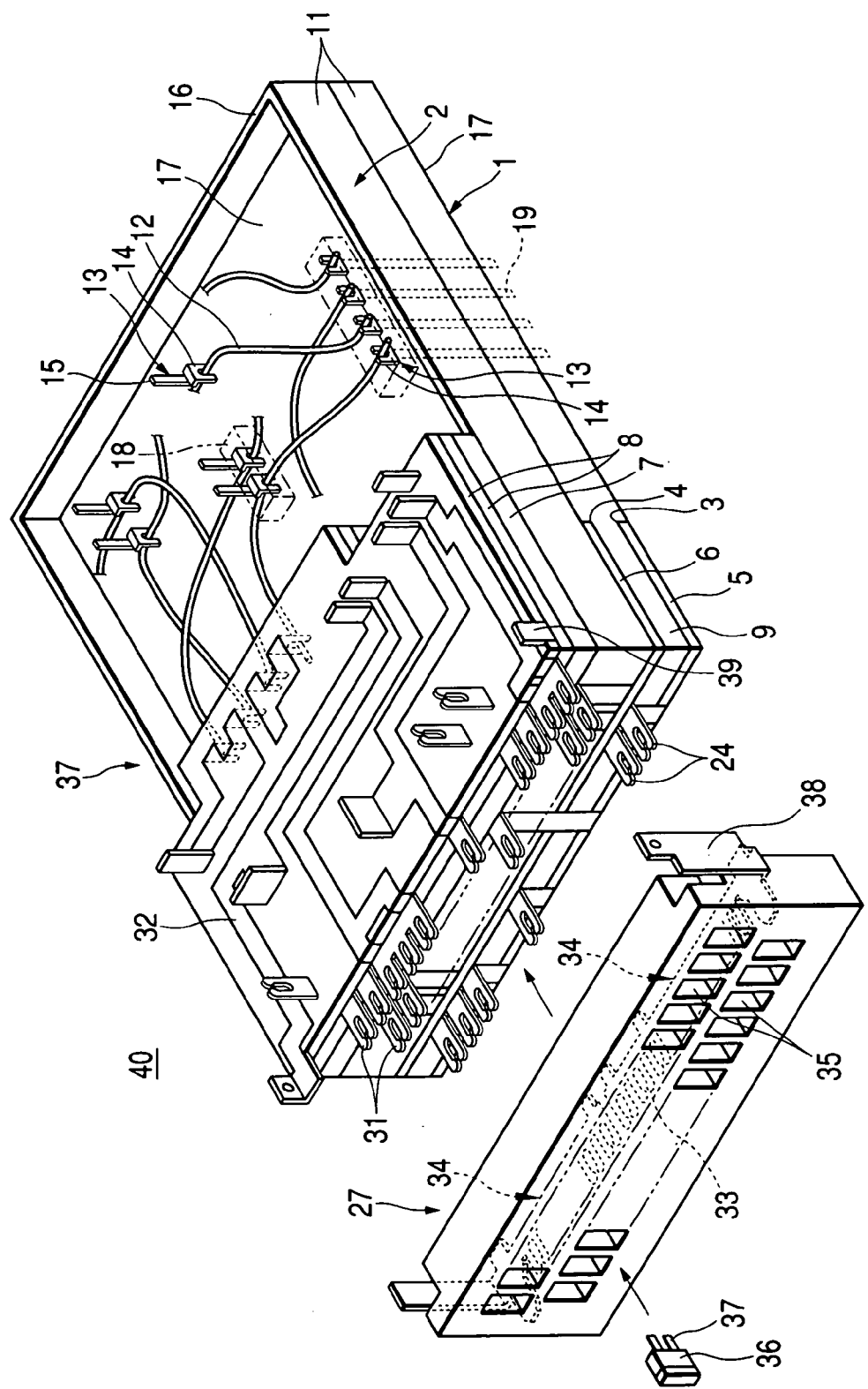
FIG. 1 is an exploded upper perspective view showing a circuit board assembling structure according to one embodiment of the invention.
Figure 2:
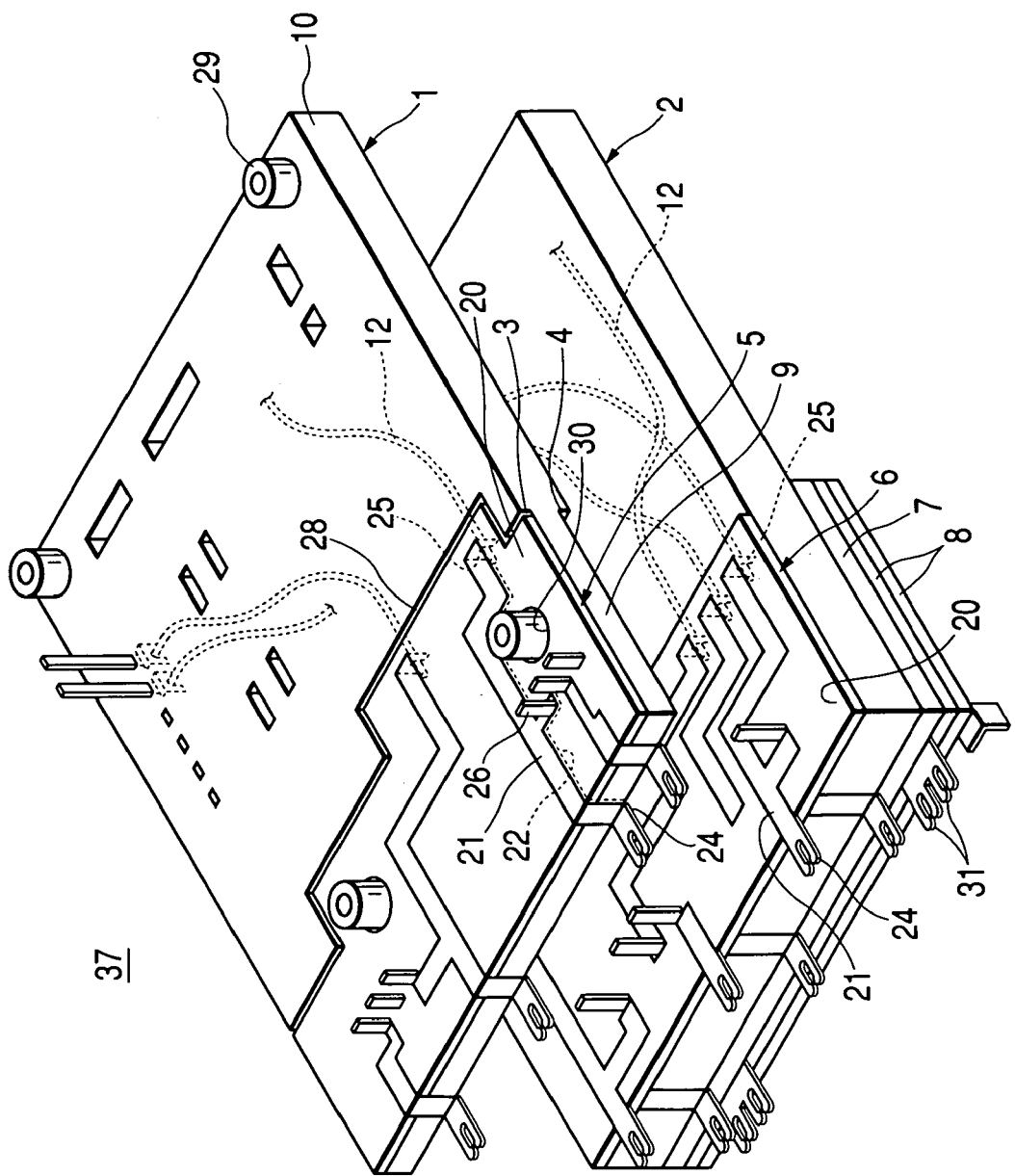
FIG. 2 is an exploded lower perspective view showing the circuit board assembling structure.
Figure 3:
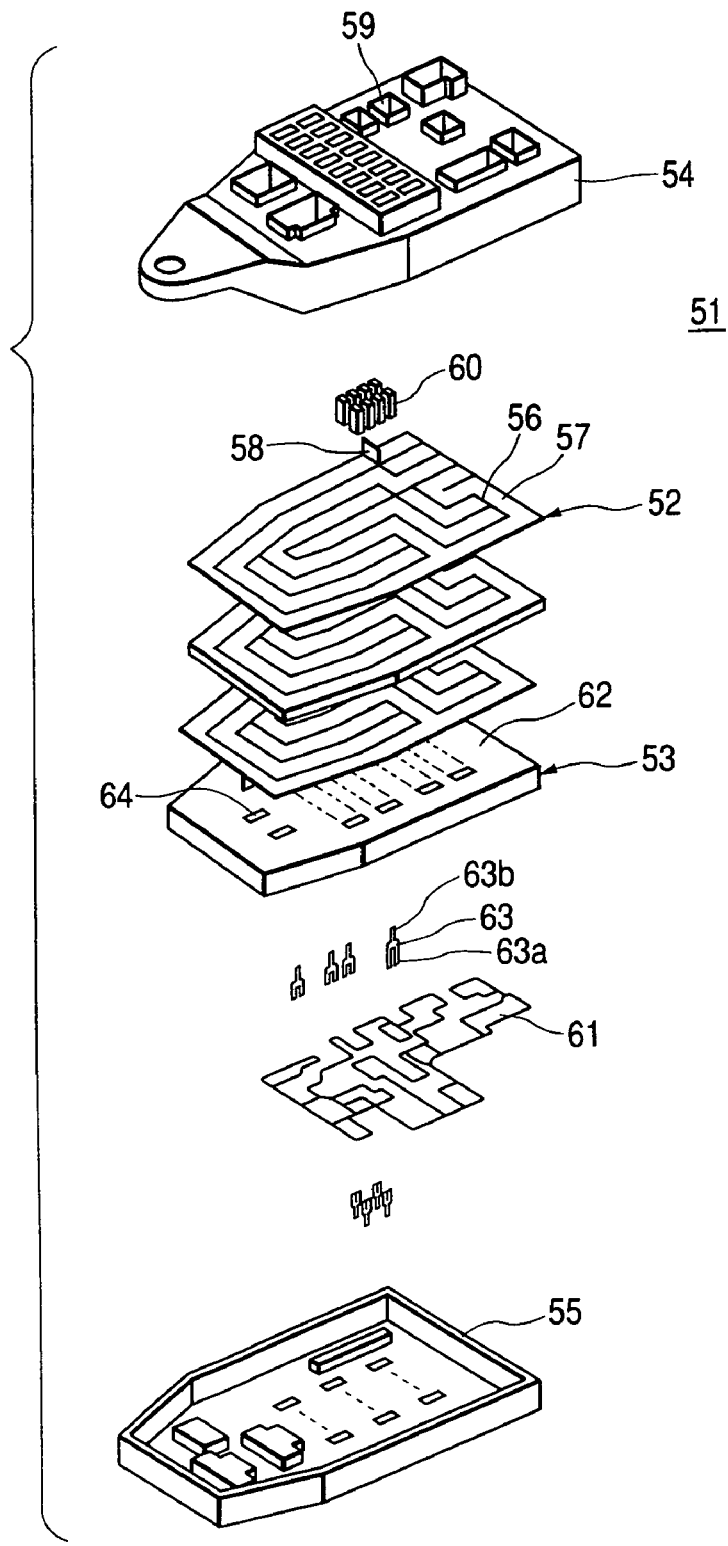
FIG. 3 is an exploded perspective view showing a conventional circuit board assembling structure.

As shown in FIGS. 1 and 2, a circuit board assembling structure according to the invention includes a plurality of (two sheets in this embodiment) wiring circuit boards 1, 2, two sheets of bus bar circuit boards 5, 6 disposed in stepped parts 3, 4 which are respectively formed on an upper face and a lower face of the lower wiring circuit board 1, and a plurality of (two sheets) bus bar circuit boards 8 which are stacked on the upper wiring circuit board 2 by way of a base board 7. This circuit board assembling structure is particularly characterized in that the two sheets of the bus bar circuit boards 5, 6 are disposed within a range of thickness of the lower wiring circuit board 1.

The lower wiring circuit board 1 has the stepped parts 3, 4 on both upper and lower faces in a forward half area, as shown in FIG. 2 (as seen from the bottom), thereby to form a thinned part 9 at the middle in a direction of thickness of the wiring circuit board 1. The bus bar circuit boards 5, 6 are disposed on both upper and lower faces of the thinned part 9 (FIG. 1).

A thickness of the bus bar circuit boards 5, 6 which have the same thickness is equal to or smaller than a depth of the step, and the total thickness of the thin-walled part 9 and the bus bar circuit boards 5, 6 is equal to or smaller than a thickness of other part 10 (see FIG. 2) in a rear half of the wiring circuit board 1. Accordingly, respective outer faces of the bus bar circuit board 5, 6 are not protruded from the upper and lower faces of the wiring circuit board 1 (see FIG. 1).

Both the upper and lower faces of the thinned part 9 are preferably reinforced with grid-shaped ribs (not shown) while reducing the weight thereof.

Therefore, the upper wiring circuit board 2 is stacked on the lower wiring circuit board 1 without clearance, and components such as a lower cover, an electronic control unit, etc. (not shown) can be arranged below the lower wiring circuit board 1 without clearance, or with a slight clearance. Therefore, the space saving can be attained.

As shown in FIG. 1, each of the wiring circuit boards 1, 2 in the respective layers includes a case 11 made of insulative resin, and a plurality of electric wires 12 which are arranged in desired shapes and connected at press-fitting portions 14 of terminals 13. The case 11 is formed in a flat shape having at least a frame-shaped vertical peripheral wall 16 and a horizontal bottom wall 17.

The terminals 13 of the wiring circuit boards 1, 2, to which the electric wires 12 are press-fitted, are fixed inside frame-shaped retaining walls 18 in the case 11. Tab-shaped or pin-shaped contact portions 15, 19 of the terminals 13 project to an opposite side to the press-fitting portions 14. For example, the tab electric contact portions 15 are contained in connector housings of a main cover (not shown) located on the upper wiring circuit board 2, and the pin-shaped contact portions 19 are passed through the lower wiring circuit board 1 to be connected to the electronic control unit (not shown). A manner of arranging the electric wires 12 and positioning the terminals 13 on the wiring circuit boards 1, 2 in the upper and lower layers can be appropriately determined according to the specification of the circuits.

As shown in FIG. 2, each of the upper and lower bus bar circuit boards 5, 6 includes an insulative substrate 20 made of synthetic resin, and bus bars 21 made of conductive metal in various shapes and arranged on the insulative substrate 20. The insulative substrate 20 is formed with grooves 22 having a same depth as a thickness of the bus bars 21. The bus bars 21 are positioned and received in the grooves 22, and insulated from one another by partitions (represented also by numeral 20) between the grooves 22. The bus bars 21 have clamping terminals 24 for connecting fuses, press-fitting terminals 25 for connecting the electric wires, and tab terminals 26 adapted to be contained in the connector housings, relay mounting parts and so on of the cover (not shown).

The clamping terminals 24 are horizontally projected from front edges of the wiring circuit boards 1, 2, and received in a fuse block 27 as shown in FIG. 1. As shown in FIG. 2, the clamping terminals 24 are vertically bent along the front end face of the wiring circuit board 1 from the bus bar circuit board 5 in the lower layer, and horizontally projected in a forward direction. The clamping terminals 24, which are projected from the bus bar circuit board 6 in the upper layer, are aligned on a same plane as a lower face of the insulative substrate 20, that is, aligned with the clamping terminals 24 of the bus bar circuit board 5 in the lower layer.

The press-fitting terminals 25 of the bus bars 21 are extended toward the electric wires 12 of the wiring circuit boards 1, 2, as shown in FIG. 2, and press-fitted to the electric wires 12 provide inside the retaining walls 18 of the cases 11. Press-fitting of the electric wires 12 is conducted after the lower bus bar circuit board 5 has been mounted on a bottom face of the lower wiring circuit board 1 (an upper side in FIG. 2), as shown in FIG. 2.

The upper bus bar circuit board 6 is mounted on a bottom face of the upper wiring circuit board 2. Pressure fitting of the electric wires 12 is conducted in this state. After the electric wires 12 in the respective layers are press-fitted, the wiring circuit boards 1, 2 in both the layers are stacked (assembled) on each other, while the upper bus bar circuit board 6 is received in the stepped part 4 at an upper side of the lower wiring circuit board 1. The bus bar circuit boards 5, 6 are respectively fixed to the wiring circuit boards 1, 2, by press fitting the electric wires 12 to the press-fitting terminals 25.

As shown in FIG. 2, positions and shapes of boundaries 28 between the bus bar circuit boards 5, 6 and the wiring circuit boards 1, 2 are appropriately set, according to pressure fitting positions of the electric wires 12 to the bus bars 21, layouts of the bus bars 21 and so on. The lower wiring circuit board 1 has short support posts 29 which serve to support the electronic control unit (not shown) and to fix the unit thereon with screws. The bus bar circuit boards 5, 6 have holes 30 allowing the support posts 29 to pass through. The holes 30 and the support posts 29 serve also as members for positioning the bus bar circuit boards 5, 6 with respect to the wiring circuit boards 1, 2.

In this embodiment, a plurality of (two sheets) of the bus bar circuit boards 8 are also provided on the upper face of the upper wiring circuit board 2 by way of the base plate 7, as shown in FIG. 1. Electronic components (not shown), for example, are disposed in an inner space of the base plate 7, and connected to the electric wires 12 and so on. It is also possible to provide the bus bar circuit boards 8 directly on the upper face of the upper wiring circuit board 2, while omitting the base plate 7 and the electronic components.

Each of the bus bar circuit boards 8 has clamping terminals 31. continued from bus bars 32 as well as the bus bar circuit boards 5, 6. The clamping terminals 31 are thus arranged in two upper and lower rows. In correspondence with the clamping terminals 24 arranged in a row, a bus bar 34 having clamping terminals 33 laterally arranged in a row is disposed in advance in the fuse block 27 (FIG. 1). The clamping terminals 24, 31, 33 in four rows are composed of the bus bars 21, 32, 34. Fuses 36 are contained in chambers 35 arrayed in two upper and lower rows in the fuse block 27, and a pair of upper and lower tab terminals 37 of the fuses 36 are clamped for connection by the clamping terminals 24, 31, 33 in the respective rows.

The fuse block 27 is joined to a circuit board assembly 37 which includes the wiring circuit boards 1, 2 and the bus bar circuit boards 5, 6, 8, in a direction of an arrow shown in FIG. 1. At the same time, a side terminal 38 of the bus bar 34 in the fuse block 27 comes into contact with a side terminal 39 of the bus bar 32 of the bus bar circuit board 8. Both the terminals 38, 39 are connected by welding or by other means.

A sub assembly 40 which is composed of the circuit board assembly 37 and the fuse block 27 is covered for protection with the main cover and the lower cover (not shown), and the electronic control unit (not shown) is mounted outside the lower cover, thereby to constitute the electric junction box. The bus bars 21 of the bus bar circuit board 5, 6 are connected to the fuses 36 by way of the clamping terminals 24, to the relays and the connectors of the exterior wire harnesses by way of the tab terminals 26, and to the connectors of the exterior wire harnesses and the electronic control unit (not shown) by way of the press-fitting terminals 25, the electric wires 12 and the terminals 15, 19.

Incidentally, it is possible to omit the upper wiring circuit board 2 and the bus bar circuit board 8 mounted thereon, and to connect the fuses 36 laterally arranged in a single row by the lower wiring circuit board 1 and two sheets of the bus bar circuit boards 5, 6. The stepped portion formed on the wiring circuit board 1 may be single so that a single bus bar circuit board is attached.

Moreover, positions, numbers, etc. of the tab terminals 26, the clamping terminals 24, and the press-fitting terminals 25 of the bus bar circuit boards 5, 6, and positions, numbers, etc. of the terminals 13 of the wiring circuit boards 1, 2 can be appropriately determined according to the specifications of the circuits. Further, it is possible to form terminals to be connected to the electric wires 12 by soldering, welding or press-fitting and so on, in place of the press-fitting terminals 25 of the bus bars 21.

It is also possible to omit the electronic control unit in constituting the electric junction box. It is also possible to form terminals for connecting relays or terminals for connecting connectors, in place of the clamping terminals 24 for connecting the fuses. Further, directivity of the upper layer and the lower layer can be appropriately changed according to a manner of installing the electric junction box. Further, the circuit board assembling structure according to the invention can be applied as the circuit board assembly for various appliances, a control panel, etc., besides the electric junction box.

What is claimed is:

1. A circuit board assembly, comprising:
   a first wiring circuit board on which electric wires are wired, the first wiring circuit board including a first part having a first thickness and a second part continued from the first part and having a second thickness smaller than the first thickness; and
   a first bus bar circuit board on which bus bars are arranged, the first bus bar circuit board disposed on the second part of the first wiring circuit board.

2. The circuit board assembly as set forth in claim 1, wherein:
   the second part is defined by forming stepped portions in both main faces of the first wiring circuit board; and
   the first bus bar circuit board is disposed on one of the stepped portions.

3. The circuit board assembly as set forth in claim 1, wherein the first bus bar circuit board has a third thickness which is determined such that an additional thickness of the second thickness and the third thickness is not greater than the first thickness.

4. The circuit board assembly as set forth in claim 1, wherein the first bus bar circuit board is formed with grooves for receiving the bus bars.

5. The circuit board assembly as set forth in claim 1, wherein the electric wires and the bus bars are electrically connected.

6. The circuit board assembly as set forth in claim 2, wherein the first bus bar circuit board disposed on one of the stepped portion is fixed to a second wiring circuit board on which electric wires are wired.

7. The circuit board assembly as set forth in claim 2, further comprising a second bus bar circuit board on which bus bars are arranged, the second bus bar circuit board disposed on the second part of the first wiring circuit board.

8. The circuit board assembly as set forth in claim 7, wherein the second bus bar circuit board is disposed on a stepped portion different from the stepped portion on which the first bus bar circuit board is disposed.

* * * * *